(12) United States Patent
Huang (10) Patent No.: US 12,021,044 B2
(45) Date of Patent: Jun. 25, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 416 days.

(21) Appl. No.: 17/067,556

(22) Filed: Oct. 9, 2020

(65) Prior Publication Data

US 2022/0115338 A1 Apr. 14, 2022

(51) Int. Cl.
*H01L 23/66* (2006.01)
*H01L 21/48* (2006.01)
*H01L 23/498* (2006.01)
*H01Q 1/22* (2006.01)

(52) U.S. Cl.
CPC .......... *H01L 23/66* (2013.01); *H01L 21/4857* (2013.01); *H01L 23/49822* (2013.01); *H01L 23/49838* (2013.01); *H01Q 1/2283* (2013.01); *H01L 2223/6677* (2013.01)

(58) Field of Classification Search
CPC ... H01Q 1/2283; H01L 23/66; H01L 2223/66; H01L 21/4857; H01L 23/49822; H01L 23/49838; H01L 2224/16227; H01L 2224/48227; H01L 2924/3511; H01L 24/16; H01L 24/48
See application file for complete search history.

(56) References Cited

U.S. PATENT DOCUMENTS

| 7,944,038 | B2* | 5/2011 | Chiu | H01Q 1/2283 |
| | | | | 257/E21.597 |
| 2015/0145107 | A1* | 5/2015 | Ng | H01L 23/552 |
| | | | | 257/659 |
| 2018/0205134 | A1* | 7/2018 | Khan | H01Q 5/314 |
| 2018/0269708 | A1* | 9/2018 | Yeh | H01L 23/645 |

* cited by examiner

Primary Examiner — Jasmine J Clark
(74) Attorney, Agent, or Firm — FOLEY & LARDNER LLP (57) ABSTRACT

The present disclosure provides a semiconductor device package. The semiconductor device package includes a first conductive component, a second conductive component, a planarization layer and an antenna layer. The second conductive component is disposed adjacent to the first conductive component. The second conductive component and the first conductive component have different thicknesses. The planarization layer is disposed on the first conductive component. The antenna layer is disposed on the first conductive component and the second conductive component.

19 Claims, 7 Drawing Sheets

SEMICONDUCTOR DEVICE PACKAGE AND METHOD OF MANUFACTURING THE SAME

BACKGROUND

1. Technical Field

The present disclosure generally relates to a semiconductor device package and a method of manufacturing the same, and to a semiconductor device package including an antenna.

2. Description of the Related Art

Semiconductor device package(s) having antennas for signal (e.g. radio frequency (RF) signal) transmission may include an antenna layer and a RF routing layer electrically connected to the antenna layer. To improve the radiation efficiency of the antenna layer, the antenna layer generally has a substrate with a relatively low dielectric constant (Dk) and loss tangent or dissipation factor (Df), which is different from a substrate of the RF routing layer. Such unbalanced structure would cause a warpage issue during the manufacturing process, which may adversely affect the performance of the semiconductor device package.

SUMMARY

In one or more embodiments, a semiconductor device package includes a first conductive component, a second conductive component, a planarization layer and an antenna layer. The second conductive component is disposed adjacent to the first conductive component. The second conductive component and the first conductive component have different thicknesses. The planarization layer is disposed on the first conductive component. The antenna layer is disposed on the first conductive component and the second conductive component.

In one or more embodiments, a semiconductor device package includes a first conductive component, a second conductive component, a package body and a third conductive component. The first conductive component has a first Young's modulus. The second conductive component has a second Young's modulus. The second conductive component and the first conductive component are disposed side-by-side. The package body at least partially covers the first conductive component and the second conductive component. The third conductive component is disposed on the first conductive component and the second conductive component. The third conductive component having a third Young's modulus. The first Young's modulus is higher than the second Young's modulus and the third Young's modulus.

In one or more embodiments, a method of manufacturing a semiconductor device package includes (a) providing a first conductive component having a first thickness; (b) providing a second conductive component having a second thickness greater than the first thickness; (c) forming a planarization layer on the first conductive component, the planarization layer and the second conductive component define a planar surface; and (d) connecting an antenna layer to the planar surface.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1A:
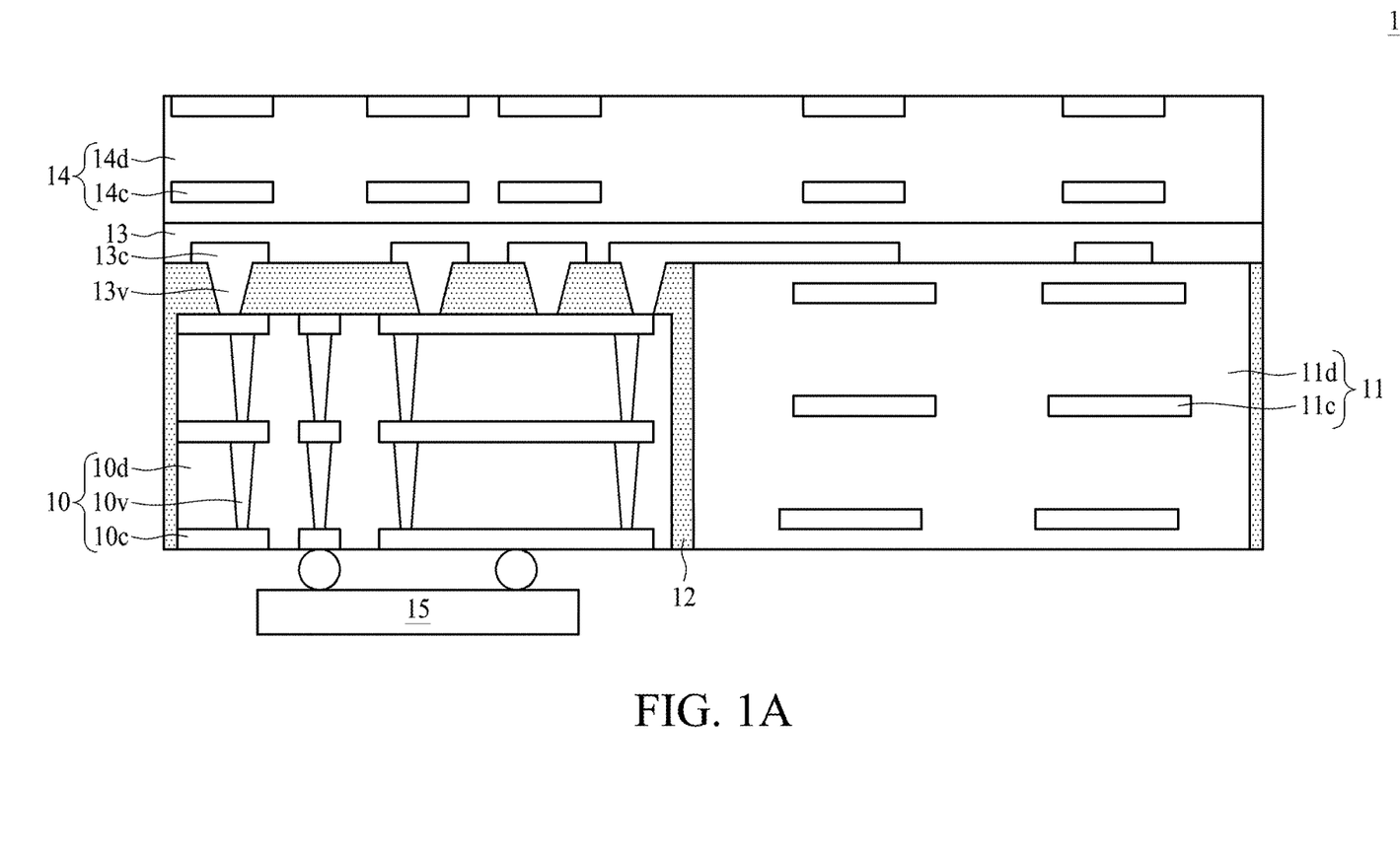
FIG. 1A illustrates a cross-sectional view of a semiconductor device package in accordance with some embodiments of the present disclosure.

FIG. 1A illustrates a cross-sectional view of a semiconductor device package 1 in accordance with some embodiments of the present disclosure. The semiconductor device package 1 includes a circuit layer 10, antenna layers 11, 14, a package body 12, an adhesive layer 13 and an electronic component 15.

The circuit layer 10 (e.g., a conductive component, a routing layer or a build-up layer) includes one or more conductive layers 10c and one or more dielectric layers 10d. A portion of the conductive layer 10c is covered or encapsulated by the dielectric layer 10d while another portion of the conductive layer 10c is exposed from the dielectric layer 10d. In some embodiments, the circuit layer 10 may include conductive vias 10v (e.g., through vias) penetrating the dielectric layer 10d to provide electrical connections between conductive layers 10c at different levels.

In some embodiments, the dielectric layer 10d may include polymers or any other suitable materials. In some embodiments, the conductive layer 10c is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. The circuit layer 10 may include any number of the dielectric layers and conductive layers depending on different design specifications.

Figure 1B:
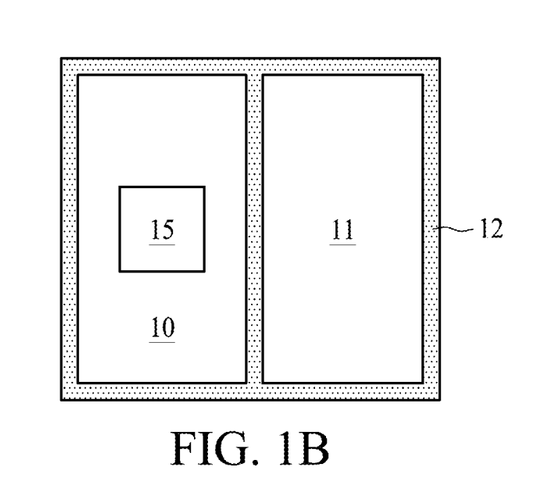
FIG. 1B illustrates a bottom view of a semiconductor device package in accordance with some embodiments of the present disclosure.
Figure 1C:
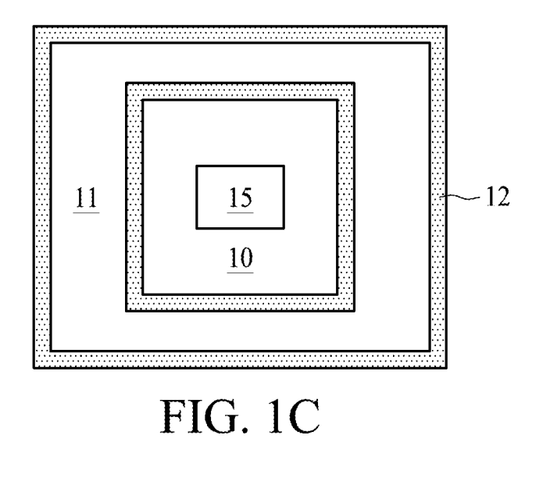
FIG. 1C illustrates a bottom view of a semiconductor device package in accordance with some embodiments of the present disclosure.
Figure 1D:
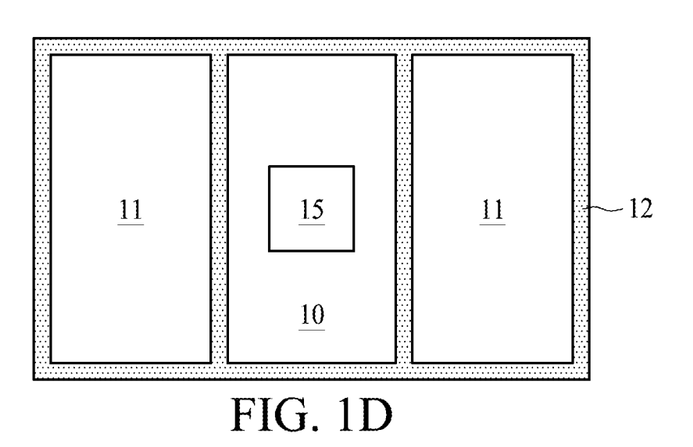
FIG. 1D illustrates a bottom view of a semiconductor device package in accordance with some embodiments of the present disclosure.

The antenna layer 11 (e.g., a conductive component) is disposed adjacent to the circuit layer 10. The antenna layer 11 and the circuit layer 10 are disposed side-by-side. For example, as shown in FIG. 1B (which illustrates a bottom view of the semiconductor device package 1 as shown in FIG. 1A, in accordance with some embodiments of the present disclosure), the circuit layer 10 and the antenna layer 11 are disposed side-by-side. For example, as shown in FIG. 1C (which illustrates a bottom view of the semiconductor device package 1 as shown in FIG. 1A, in accordance with some embodiments of the present disclosure), the antenna layer 11 surrounds the circuit layer 10. For example, as shown in FIG. 1D (which illustrates a bottom view of the semiconductor device package 1 as shown in FIG. 1A, in accordance with some embodiments of the present disclosure), the circuit layer 10 is disposed between the antenna layers 11. In other words, the circuit layer 10 is sandwiched by the antenna layers 11.

The antenna layer 11 is spaced apart from the circuit layer 10. For example, there is a gap between the antenna layer 11 and the circuit 10. The antenna layer 11 may be connected to the adhesive layer 13 (e.g., a die attach film, DAF). For example, the antenna layer 11 is in contact with the adhesive layer 13. In some embodiments, unlike the antenna layer 11, the circuit layer 10 is spaced apart from the adhesive layer 13. For example, there is a gap between the circuit layer 10 and the adhesive layer 13. For example, a surface of the circuit layer 10 facing the adhesive layer 13 and a surface of the antenna layer 11 facing the adhesive layer 13 have different elevations with respect to the adhesive layer 13. For example, a distance between the circuit layer 10 and the adhesive layer 13 is larger than a distance between the antenna layer 11 and the adhesive layer 13. For example, the circuit layer 10 and the antenna layer 11 have different thicknesses.

The antenna layer 11 includes one or more conductive layers 11c and one or more dielectric layers 11d. The conductive layer 11c is covered or encapsulated by the dielectric layer 11d. In some embodiments, the conductive layer 11c defines or includes an antenna pattern. The conductive layer 11c may be electromagnetically coupled to the conductive layer 13c disposed on the antenna layer 11 for signal transmission.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, the conductive layer 11c is, or includes, a conductive material such as a metal or metal alloy. Examples of the conductive material include Au, Ag, Cu, Pt, Pd, other metal(s) or alloy(s), or a combination of two or more thereof. The antenna layer 11 may include any number of the dielectric layers and conductive layers depending on different design specifications.

In some embodiments, a Dk and a Df of the dielectric layer 11d is lower than a Dk and a Df of the dielectric layer 10d. For example, the dielectric layer 11d has a Dk less than approximately 5. The dielectric layer 11d has a Dk less than approximately approximately 3. The dielectric layer 11d has a Df less than approximately 0.005. The dielectric layer 11d has a Df less than approximately 0.003.

In some embodiments, a Young's modulus of the dielectric layer 10d is higher than a Young's modulus of the dielectric layer 11d. In some embodiments, a rigidity of the dielectric layer 10d is higher than a rigidity of the dielectric layer 11d. In some embodiments, a coefficient of thermal expansion (CTE) of the dielectric layer 11d is higher than a CTE of the dielectric layer 10d. For example, the CTE of the dielectric layer 11d is from about 120 $K^{-1}$ to about 150 $K^{-1}$, and the CTE of the dielectric layer 10d is from about 20 $K^{-1}$ to about 50 $K^{-1}$. In some embodiments, the dielectric layer 10d may include fibers, and the dielectric layer 11d does not include fibers.

The package body 12 is connected to the adhesive layer 13. The package body 12 covers or encapsulates a portion of the circuit layer 10 and the antenna layer 11. The package body 12 exposes a portion of the circuit layer 10 (e.g., a bottom surface of the conductive layer 10c) for electrical connections. The package body 12 exposes a portion of the antenna layer 11 (e.g., a bottom surface of the antenna layer 11). For example, a bottom surface of the package body 12, the bottom surface of the circuit layer 10 and the bottom surface of the antenna layer 11 are substantially coplanar with each other. The package body 12 is disposed between the circuit layer 10 and the antenna layer 11. For example, the package body 12 is disposed within the gap between the circuit layer 10 and the antenna layer 11. The package body 12 is disposed between the circuit layer 10 and the adhesive layer 13. In some embodiments, the package body 12 includes an epoxy resin having fillers dispersed therein.

The electronic component 15 is disposed on the portion of the circuit layer 10 exposed from the package body 12 (e.g., on the bottom surface of the conductive layer 10c). The electronic component 15 is electrically connected to the circuit layer 10 by way of flip-chip or wire-bond techniques. The electronic component 15 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The antenna layer 14 (or conductive component) is disposed on a surface of the adhesive layer 13 facing away from the antenna layer 11. For example, the antenna layer 14 and the antenna layer 11 are disposed on opposite surfaces of the adhesive layer 13. The antenna layer 14 may be connected to the adhesive layer 13. For example, the antenna layer 13 is in contact with the adhesive layer 13. The antenna layer 14 includes one or more conductive layers 14c and one or more dielectric layers 14d. The conductive layer 14c is covered or encapsulated by the dielectric layer 14d. In some embodiments, the conductive layer 14c defines or includes an antenna pattern. The conductive layer 14c may be electromagnetically coupled to the conductive layer 13c and the conductive layer 11c for signal transmission.

In some embodiments, the dielectric layer 14d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, the conductive layer 14c is, or includes, a conductive material such as a metal or metal alloy. Examples of the conductive material include Au, Ag, Cu, Pt, Pd, other metal(s) or alloy(s), or a combination of two or more thereof. The antenna layer 14 may include any number of the dielectric layers and conductive layers depending on different design specifications.

In some embodiments, the dielectric layer 14d and the dielectric layer 11d may include the same material. For example, the dielectric layer 14d and the dielectric layer 11d may include the same Dk, Df, CTE, Young's modulus and rigidity. Alternatively, the dielectric layer 14d and the dielectric layer 11d may include different materials. In some embodiments, a Dk and a Df of the dielectric layer 14d is lower than the Dk and the Df of the dielectric layer 10d. For example, the dielectric layer 14d has a Dk less than approximately 5. The dielectric layer 14d has a Dk less than approximately approximately 3. The dielectric layer 14d has a Df less than approximately 0.005. The dielectric layer 14d has a Df less than approximately 0.003. In some embodiments, the rigidity of the dielectric layer 10d is higher than a rigidity of the dielectric layer 14d. In some embodiments, a Young's modulus of the dielectric layer 14d is lower than a Young's modulus of the dielectric layer 10d. In some embodiments, a CTE of the dielectric layer 14d is higher than the CTE of the dielectric layer 10d. In some embodiments, the dielectric layer 14d does not include fibers.

In some embodiments, the antenna layer 14 and the antenna layer 11 may include different types of antenna. Alternatively, the antenna layer 14 and the antenna layer 11 may include the same type of antenna. In some embodiments, the antenna layer 14 and the antenna layer 11 may include different operation frequencies or bandwidths. Alternatively, the antenna layer 14 and the antenna layer 11 may include the same operation frequency or bandwidth.

In some comparative embodiments, the antenna layer 11 as shown in FIG. 1A is omitted, and the circuit layer 10 is disposed on the entire bottom surface of the adhesive layer 13. For example, the antenna layer 11 is replaced by the circuit layer 10. However, as mentioned above, the dielectric layer 10d of the circuit layer 10 and the dielectric layer 14d of the antenna layer 14 include different CTE and rigidity, and such unbalanced structure would cause a warpage issue (e.g., the warpage is larger than 5 millimeters) during the manufacturing process, which may result in the failure of the semiconductor device package.

In accordance with the embodiments, as shown in FIGS. 1A to 1D, there are two kinds of dielectric layers (e.g., the dielectric layers 10d and 11d) disposed on the surface of the adhesive layer 13 facing away the circuit layer 14, and the dielectric layers 11d and the dielectric layer 14d can include the same or similar CTE and rigidity. Hence, the warpage issue may be eliminated or mitigated.

In addition, since the circuit layer 10 and the antenna layer 11 are formed by different processes, they may have different thicknesses, which would increase the difficulty of the manufacturing process. In some embodiments as shown in FIG. 1A, the package body 12 may function as a leveling layer (or a planarization layer) to increase the thickness of the circuit layer 10. For example, the package body 12 covers the circuit layer 10, and the conductive layer 13c is disposed on the package body and electrically connected to the circuit layer 10 through the conductive via 13v. Hence, the total thickness of the circuit layer 10 and the package body 12 is substantially the same as the thickness of the antenna layer 11, and the package body 12, the circuit layer 10 and the antenna layer 11 may define a substantially planar top surface, which can facilitate the subsequent operations of forming the antenna layer 14 and the adhesive layer 13. In some embodiments, the conductive via 13v may be omitted, and the signal transmission between the conductive layer 13c and the conductive layer 10c can be achieved by electromagnetically coupling.

In some embodiments, the conductive layer 13c and the conductive via may function as a feeding point (or a feeding line) of the antenna layer 14. The feeding distance (e.g., the distance between the antenna layer 14 and the circuit layer 10) can be adjusted by controlling the thickness of the package body 12 (e.g., the thickness of a portion of the package body 12 between the antenna layer 14 and the circuit layer 10) to meet the design requirement, which can improve the performance of the antenna layer 14.

Figure 2A:
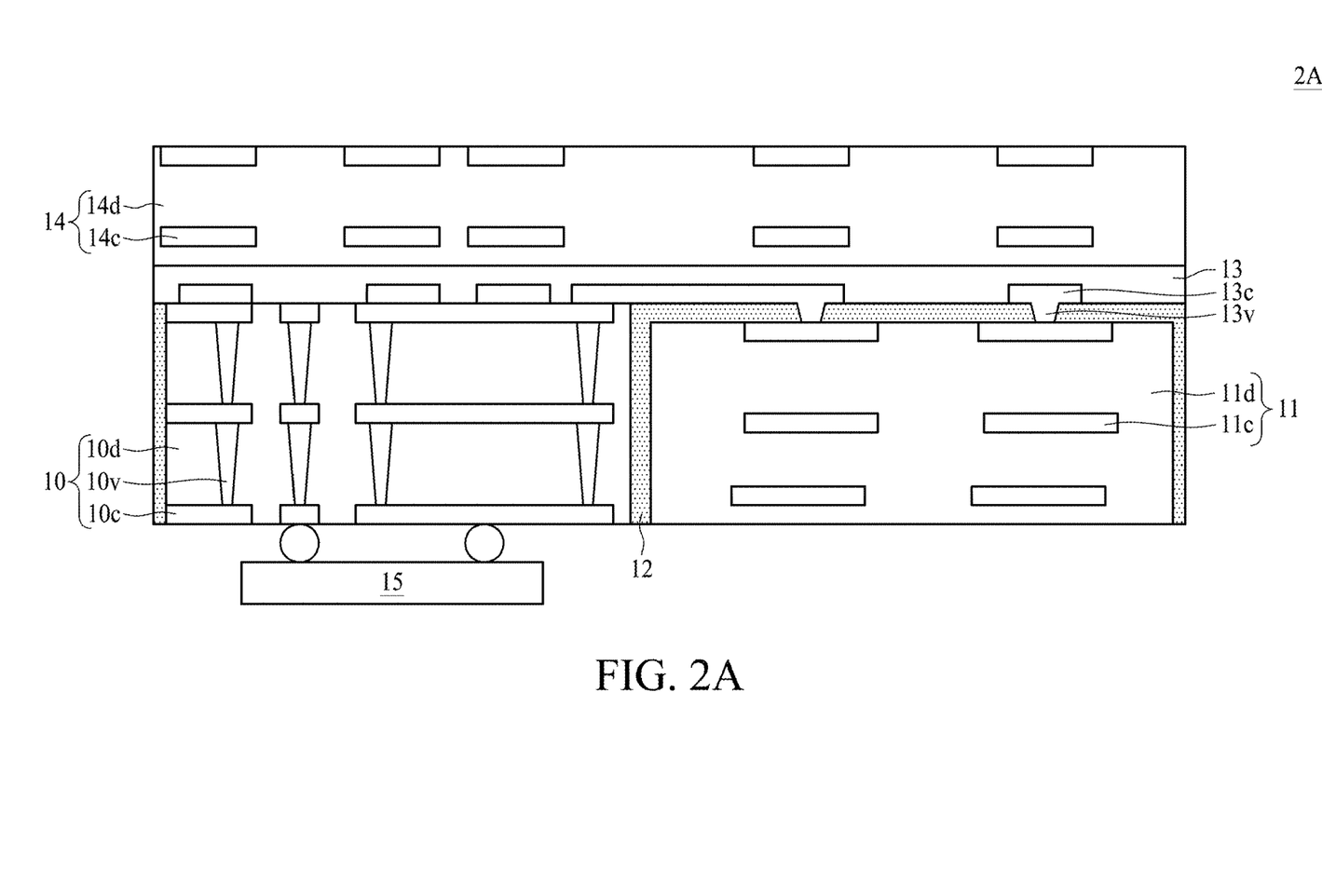
FIG. 2A illustrates a cross-sectional view of a semiconductor device package in accordance with some embodiments of the present disclosure.

FIG. 2A illustrates a cross-sectional view of a semiconductor device package 2A, in accordance with some embodiments of the present disclosure. The semiconductor device package 2A is similar to the semiconductor device package 1 as shown in FIG. 1A, and some of the differences therebetween are described below.

As shown in FIG. 2A, the thickness of the circuit layer 10 is less than the thickness of the antenna layer 11. The circuit layer 10 is in contact with the adhesive layer 13. The conductive layer 10c of the circuit layer 10 is in contact with the conductive layer 13c. The antenna layer 11 is spaced apart from the adhesive layer 13. For example, there is a gap between the antenna layer 11 and the adhesive layer 13. The conductive layer 13c is disposed on the package body 12 and electrically connected to the conductive layer 11c of the antenna layer 11 through the conductive via 13v for signal transmission. The package body 12 is disposed between the antenna layer 11 and the adhesive layer 13.

Figure 2B:
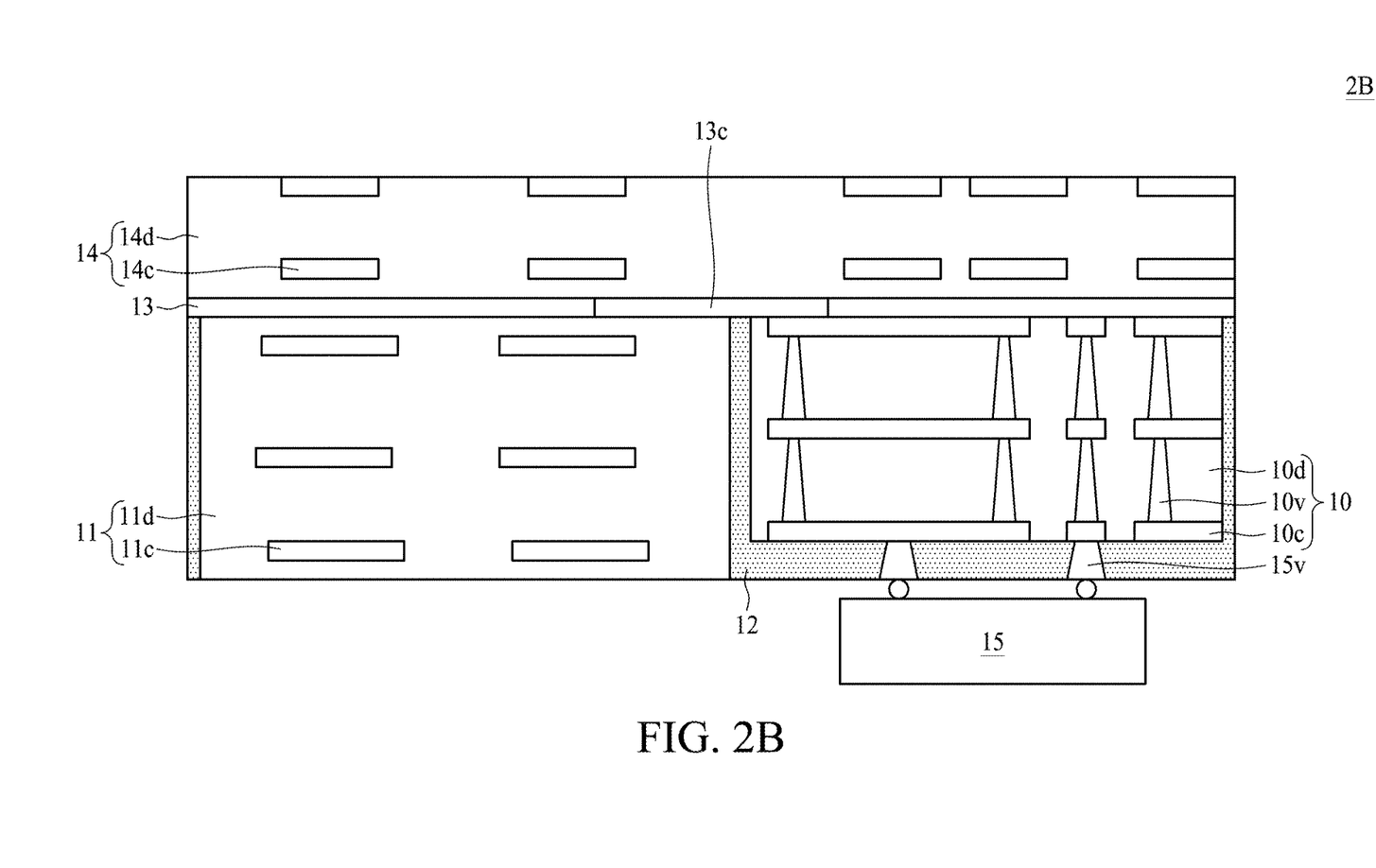
FIG. 2B illustrates a cross-sectional view of a semiconductor device package in accordance with some embodiments of the present disclosure.

FIG. 2B illustrates a cross-sectional view of a semiconductor device package 2B, in accordance with some embodiments of the present disclosure. The semiconductor device package 2B is similar to the semiconductor device package 1 as shown in FIG. 1A, and some of the differences therebetween are described below.

The antenna layer 10 is in contract with the adhesive layer 13. A bottom surface of the circuit layer 10 facing away from the adhesive layer 13 and a bottom surface of the antenna layer 11 facing away from the adhesive layer 13 are non-coplanar. For example, the bottom surface of the circuit layer 10 and the bottom surface of the antenna layer 11 have different elevations with respect to the adhesive layer 13. The bottom surface of the circuit layer 10 is covered or encapsulated by the package body 12. A conductive via 15v penetrates the package body 12 and electrically connects the electronic component 15 with the circuit layer 10 (e.g., the conductive layer 10c of the circuit layer 10).

FIG. 3A, FIG. 3B, FIG. 3C, FIG. 3D, FIG. 3E and FIG. 3F are cross-sectional views of a semiconductor device package at various stages of fabrication, in accordance with some embodiments of the present disclosure. At least some of these figures have been simplified for a better understanding of the aspects of the present disclosure. In some embodiments, the method illustrated in FIG. 3A, FIG. 3B, FIG. 3C, FIG. 3D, FIG. 3E and FIG. 3F may be used to manufacture the semiconductor device package 1 as shown in FIG. 1A.

Figure 3A:
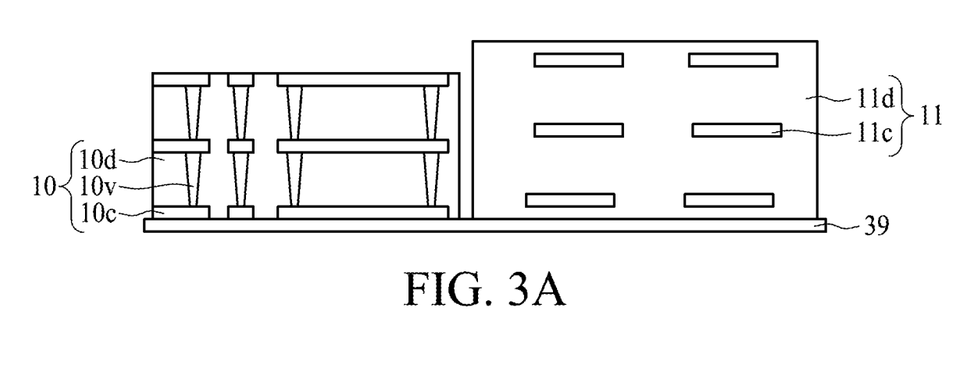
FIG. 3A, FIG. 3B, FIG. 3C, FIG. 3D, FIG. 3E and FIG. 3F illustrate one or more stages of a method of manufacturing a semiconductor device package in accordance with some embodiments of the present disclosure.

Referring to FIG. 3A, a carrier 39 is provided. In some embodiments, the carrier 39 may include a release layer thereon to facilitate the subsequent operations. The circuit layer 10 and the antenna layer 11 are disposed on the carrier 39. The circuit layer 10 is adjacent to the antenna layer 11 and spaced apart from the antenna layer 11. For example, there is a gap between the circuit layer 10 and the antenna layer 11. The circuit layer 10 may include a dielectric layer 10d, a conductive layer 10c and a conductive via 10v. The antenna layer 11 may include a dielectric layer 11d and a conductive layer 11c.

Figure 3B:
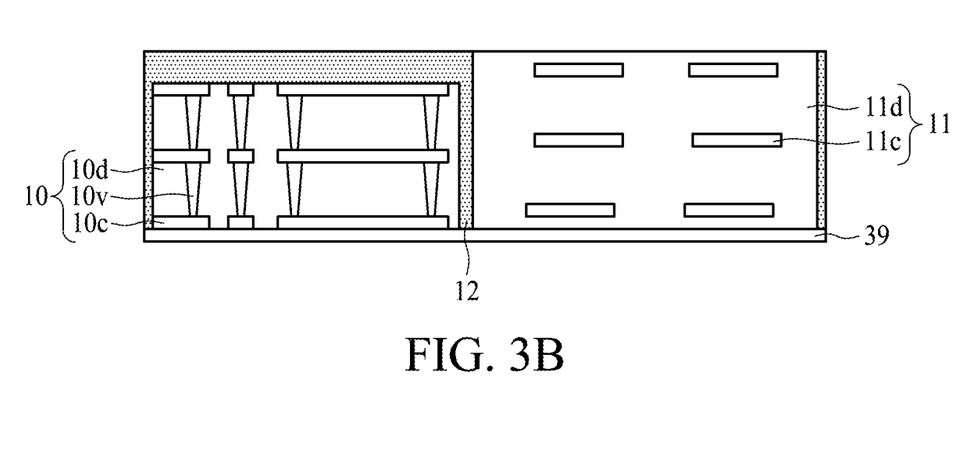

Referring to FIG. 3B, a package body 12 is formed on the carrier 39. The package body 12 fully covers the circuit layer 10. The package body 12 covers a portion of the antenna layer 11 (e.g., lateral surfaces of the antenna layer 11) and exposes another portion of the antenna layer 11 (e.g., a top surface of the antenna layer 11). In some embodiments, the package body 12 may be formed to fully cover the circuit layer 10 and the antenna layer 11, and a portion of the package body 12 can be then removed to expose the top surface of the antenna layer 11. In some embodiments, the portion of the package body 12 can be removed by grinding or any other suitable operations. In some embodiments, the package body 12 may be formed by, for example, transfer molding, compression molding or any other suitable techniques.

Figure 3C:
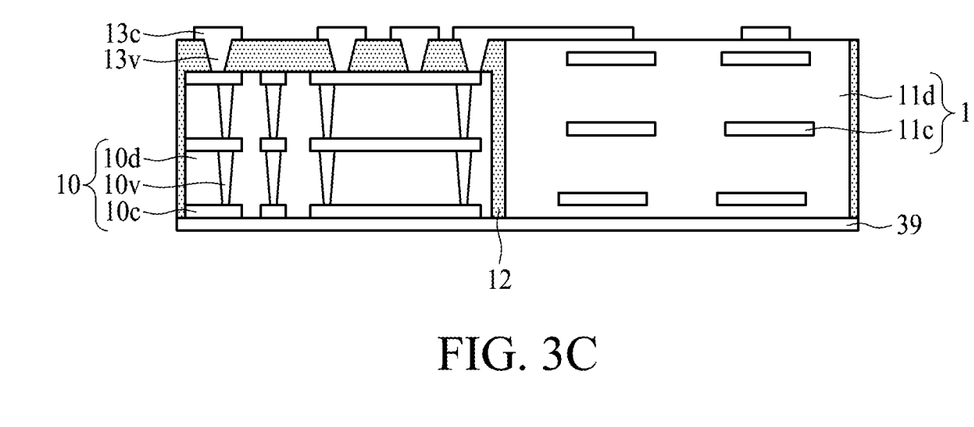

Referring to FIG. 3C, a conductive layer 13c is formed on the package body 12 and the antenna layer 11. The conductive layer 13c is electrically connected with the conductive layer 10c of the circuit layer 10 through a conductive via 13v. In some embodiments, the conductive layer 13c and the conductive via 13v may be formed by the following operations: (i) forming one or more openings penetrating the package body 12 to expose the conductive layer 10c by, for example, laser drilling or any other suitable techniques; and (ii) forming the conductive material on the package body 12 and within the openings by, for example, plating or any other suitable techniques.

Figure 3D:
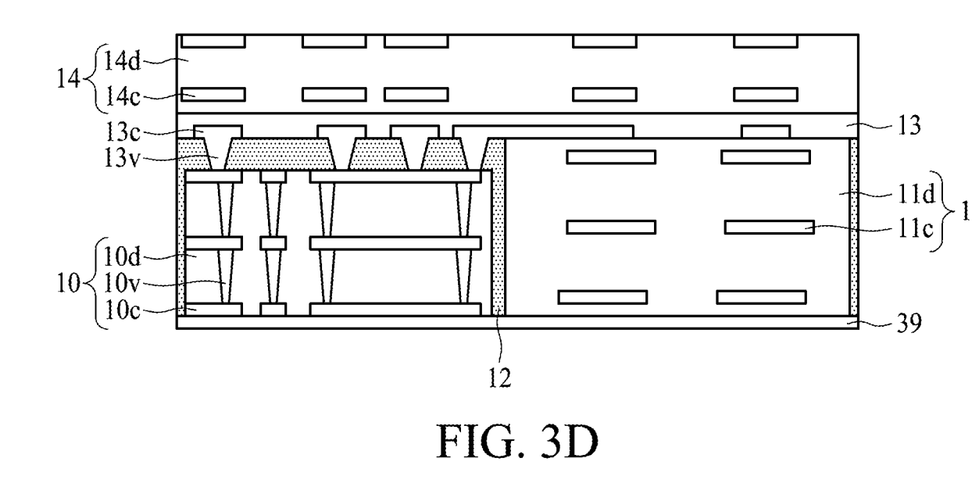

Referring to FIG. 3D, an adhesive layer 13 is disposed on the package body 12 and the antenna layer 11. The adhesive layer 13 is in contact with the package body 12 and the antenna layer 11. The adhesive layer 13 covers the conductive layer 13c. The adhesive layer 13 may be formed by, for example, lamination or any other suitable operations. An antenna layer 14 is then disposed on the adhesive layer 13. The antenna layer 14 is connected with the adhesive layer 13. In some embodiments, the antenna layer 14 may be disposed on the adhesive layer 13 by, for example, pick-and-place or any other suitable operations.

Figure 3E:
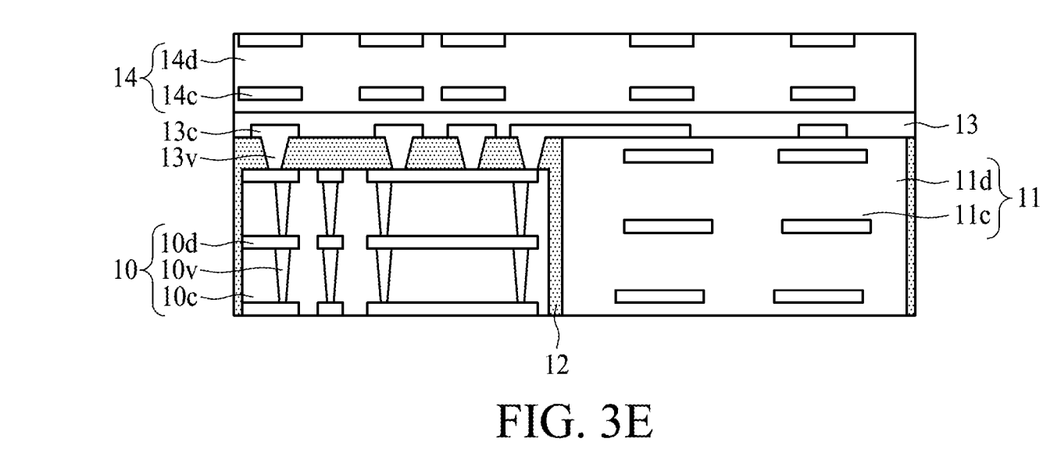

Referring to FIG. 3E, the carrier 39 is removed (i.e., de-carrier) to expose a portion of the circuit layer 10, the antenna layer 11 and the package body 12 (e.g., bottom surfaces of the circuit layer 10, the antenna layer 11 and the package body 12).

Figure 3F:
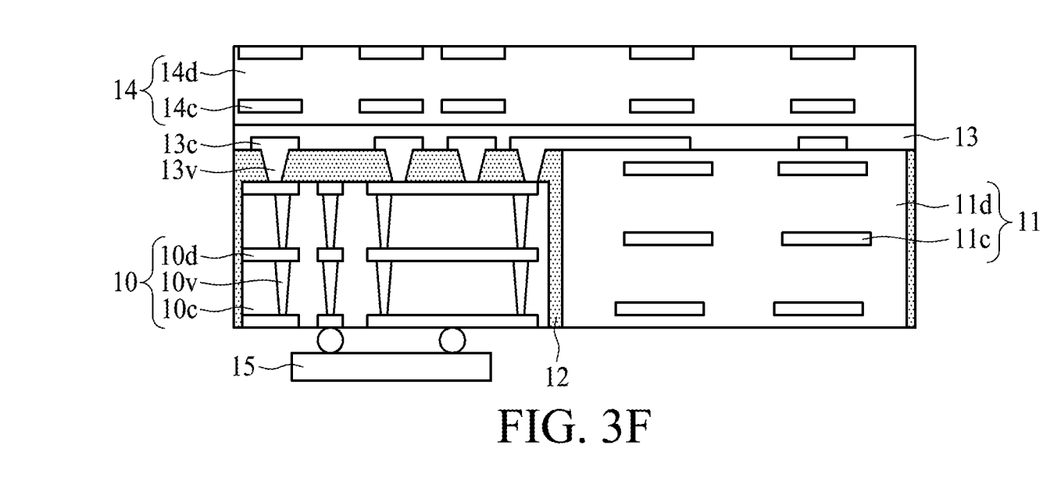

Referring to FIG. 3F, an electronic component 15 is disposed on the surface of the circuit layer 10 exposed from the package body 12. The electronic component 15 is electrically connected to the circuit layer 10 (e.g., to the conductive layer 10c of the circuit layer 10) by way of flip-chip or wire-bond techniques.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a first conductive component;
   a second conductive component disposed adjacent to the first conductive component, the second conductive component and the first conductive component having different thicknesses;
   a planarization layer disposed on the first conductive component;
   an antenna layer comprising an antenna and disposed on the first conductive component and the second conductive component; and
   an adhesive layer connecting the antenna layer with the first conductive component and the second conductive component.

2. The semiconductor device package of claim 1, wherein a total thickness of the first conductive component and the planarization layer is substantially the same as a thickness of the second conductive component.

3. The semiconductor device package of claim 1, wherein
   the first conductive component has a first conductive layer and a first dielectric layer at least partially covering the first conductive layer;
   the second conductive component has a second conductive layer and a second dielectric layer at least partially covering the second conductive layer; and a coefficient of thermal expansion (CTE) of the first dielectric layer is different from a CTE of the second dielectric layer.

4. The semiconductor device package of claim 1, wherein the second conductive component has a second conductive layer and a second dielectric layer at least partially covering the second conductive layer;
the antenna layer has a third conductive layer and a third dielectric layer covering the third conductive layer; and
a CTE of the second dielectric layer is substantially the same as a CTE of the third dielectric layer.

5. The semiconductor device package of claim 1, wherein the adhesive layer is in contact with the planarization layer and the second conductive component.

6. The semiconductor device package of claim 1, further comprising a fourth conductive layer disposed on the planarization layer and covered by the adhesive layer, wherein the fourth conductive layer extends within the planarization layer to be electrically connected to the first conductive component.

7. The semiconductor device package of claim 6, wherein the fourth conductive layer electrically connects the first conductive component with the second conductive component.

8. The semiconductor device package of claim 1, wherein the planarization layer is disposed between the first conductive component and the second conductive component.

9. The semiconductor device package of claim 1, wherein the second conductive component surrounds the first conductive component.

10. The semiconductor device package of claim 1, further comprising a plurality of the second conductive components, wherein the first conductive component is sandwiched by the second conductive components.

11. A semiconductor device package, comprising:
a first conductive component, wherein the first conductive component includes a first antenna layer;
a second conductive component disposed adjacent to the first conductive component, the second conductive component and the first conductive component having different thicknesses;
a planarization layer disposed on the first conductive component; and
a second antenna layer comprising an antenna and disposed on the first conductive component and the second conductive component.

12. A semiconductor device package, comprising:
a first conductive component having a first Young's modulus;
a second conductive component having a second Young's modulus, the second conductive component and the first conductive component disposed side-by-side;
a package body at least partially covering the first conductive component and the second conductive component; and
a third conductive component disposed on the first conductive component and the second conductive component, the third conductive component having a third Young's modulus,
wherein the first Young's modulus is higher than the second Young's modulus and the third Young's modulus.

13. The semiconductor device package of claim 12, wherein the second Young's modulus is substantially the same as the third Young's modulus.

14. The semiconductor device package of claim 12, wherein a thickness of the first conductive component is different from a thickness of the second conductive component.

15. The semiconductor device package of claim 12, further comprising an adhesive layer is in contact with the package body, the first conductive component and the third conductive component.

16. The semiconductor device package of claim 15, further comprising a conductive layer disposed on the package body and covered by the adhesive layer, wherein the conductive layer electrically connected between the first conductive component and the second conductive component.

17. The semiconductor device package of claim 12, further comprising:
a conductive via penetrating the package body; and
an electronic component electrically connected to the first conductive component through the conductive via.

18. The semiconductor device package of claim 12, wherein two or more lateral surfaces of the first conductive component are covered by the package body.

19. The semiconductor device package of claim 18, wherein a top surface and two or more lateral surfaces of the second conductive component are covered by the package body.

* * * * *